(12) United States Patent
Essaian et al.

(10) Patent No.: US 7,742,510 B2
(45) Date of Patent: Jun. 22, 2010

(54) COMPACT SOLID-STATE LASER WITH NONLINEAR FREQUENCY CONVERSION USING PERIODICALLY POLED MATERIALS

(75) Inventors: Stepan Essaian, San Jose, CA (US); Andrei Shchegrov, Campbell, CA (US)

(73) Assignee: Spectralus Corporation, Santa Clara, CA (US)

( * ) Notice: Subject to any disclaimer, the term of this patent is extended or adjusted under 35 U.S.C. 154(b) by 379 days.

(21) Appl. No.: 11/788,916

(22) Filed: Apr. 23, 2007

(65) Prior Publication Data

US 2008/0317072 A1 Dec. 25, 2008

Related U.S. Application Data

(60) Provisional application No. 60/795,212, filed on Apr. 27, 2006.

(51) Int. Cl.
*H01S 3/10* (2006.01)
(52) U.S. Cl. .............................. 372/21; 372/22; 372/23; 372/70; 372/75
(58) Field of Classification Search ...................... 372/21
See application file for complete search history.

(56) References Cited

U.S. PATENT DOCUMENTS

| | | | |
|---|---|---|---|
| 4,953,166 A * | 8/1990 | Mooradian ................... 372/21 |
| 5,402,154 A | 3/1995 | Shibaguchi et al. |
| 5,663,979 A * | 9/1997 | Marshall ..................... 372/103 |
| 2004/0208602 A1 | 10/2004 | Plante |
| 2005/0265411 A1 * | 12/2005 | Takeuchi et al. .............. 372/39 |
| 2006/0078019 A1 * | 4/2006 | Wang et al. ................... 372/39 |
| 2008/0317072 A1 | 12/2008 | Essaian et al. |

* cited by examiner

*Primary Examiner*—Armando Rodriguez
*Assistant Examiner*—Xnning Niu
(74) *Attorney, Agent, or Firm*—Wallace IP PLC; Kevin Pontius

(57) ABSTRACT

A compact optically-pumped solid-state laser designed for efficient nonlinear intracavity frequency conversion into desired wavelengths using periodically poled nonlinear crystals. These crystals contain dopants such as MgO or ZnO and/or have a specified degree of stoichiometry that ensures high reliability. The laser includes a solid-state gain media chip, such as $Nd:YVO_4$, which also provides polarization control of the laser; and a periodically poled nonlinear crystal chip such as PPMgOLN or PPZnOLT for efficient frequency doubling of the fundamental infrared laser beam into the visible wavelength range. The described designs are especially advantageous for obtaining low-cost green and blue laser sources.

28 Claims, 8 Drawing Sheets

US 7,742,510 B2

COMPACT SOLID-STATE LASER WITH NONLINEAR FREQUENCY CONVERSION USING PERIODICALLY POLED MATERIALS

PRIORITY INFORMATION

This application claims priority from, commonly assigned U.S. Provisional Application U.S. 60/795,212, filed Apr. 27, 2006.

BACKGROUND OF THE INVENTION

Compact, efficient, and low-cost laser sources in the visible and ultraviolet spectral regions have long been desired for a variety of applications. These applications include laser-based projection displays, optical storage, bio-analytical instrumentation, semiconductor inspection and spectroscopy. Semiconductor lasers, which provide a low-cost, compact, and efficient platform, rely on material systems such as InGa(Al)P that lase most efficiently in the near-infrared spectral region. Efficient operation down to ~650 nm (red color) can be achieved without serious technological challenges and some semiconductor laser designs can be extended down to ~635 nm with however decreasing efficiency and reliability. On the shorter wavelength side of the visible region, GaN systems have been developed in recent years and lasers in the violet (~400 nm to ~445 nm) spectral range have been commercialized. However, achieving wavelengths >470 nm in an efficient and reliable way represents a nearly insurmountable challenge. Thus, the majority of the visible spectrum (i.e., from ~470 nm blue to ~635 nm red) does not currently have an efficient semiconductor laser solution.

Of these colors (wavelengths), the absence of green is perhaps the most notable since this color corresponds to the peak sensitivity of the human eye. Indeed, no direct solution for a green semiconductor laser is currently available. The indirect solution, commercialized since the 1990s, has been based on nonlinear frequency doubling (also known as second-harmonic generation, or SHG) of neodymium (Nd)-based solid-state lasers, such as Nd:$Y_3Al_5O_{12}$ (Nd:YAG) or Nd:$YVO_4$. These solid-state gain materials can be pumped by infrared semiconductor lasers (e.g., at ~808 nm) and produce laser radiation at ~1064 nm wavelength. This 1064 nm radiation can then be frequency doubled into the green 532 nm wavelength using nonlinear crystals such as Potassium Titan Phosphate (KTP) or Lithium Borate (LBO). A similar technique can be used to obtain the blue color, e.g. 473 nm by frequency-doubling a 946 nm solid-state laser. A review of such approaches can be found in the book by W. P. Risk, T. R. Gosnell and A. V. Nurmikko, "Compact Blue-Green Lasers", Cambridge University Press (2003). Furthermore, the low-cost platform can be achieved by using so-called microchip technology, where the gain chip and non-linear crystal are bonded to form a monolithic laser cavity. The microchip concept was apparently first proposed by Mooradian (U.S. Pat. No. 5,365,539).

However, the currently available microchip lasers lack the efficiency and flexibility required in many applications, especially at higher power levels, e.g. from several hundred milliwatts up to several Watts. This is mainly due to the frequency conversion inefficiency of conventional nonlinear materials such as KTP. In order to obtain hundreds of milliwatts of green color from a KTP-based microchip laser, one has to provide a significant power margin for the fundamental infrared laser, which imposes thermal, size, and cost limitations on the overall laser system design. Furthermore, traditional bulk nonlinear materials such as KTP are restricted as to their scope of frequency conversion. For example, KTP is used for frequency doubling into the green color but cannot be practically used for frequency doubling into the blue color, so one has to search for different nonlinear materials with their own limitations in efficiency, reliability, and cost.

Laurel (U.S. Pat. No. 6,259,711), proposed that many of such limitations can be overcome by the use of periodically poled nonlinear crystals. These crystals can be engineered to provide high nonlinearity for the desired conversion wavelength. Therefore, such a laser design implemented in a microchip architecture, could address many of the restrictions associated with conventional bulk nonlinear materials.

However, embodiments of that invention suffer from serious limitations, which, to our knowledge, have prevented commercialization of this platform, and, to this day, visible wavelength microchip lasers continue to rely on bulk nonlinear materials such as KTP and $KNbO_3$, the latter material being used to produce the blue color (see, e.g., World Patent Application WO2005/036,703). The origin of such limitations lies in the choice of periodically poled nonlinear crystals proposed in Laurell's invention, i.e. $KTiOPO_4$ (KTP), $LiNbO_3$ (LN), and $LiTaO_3$ (LT). These materials possess high nonlinearity and can be readily poled into periodic structures for frequency doubling. However, the practical use of these materials is very limited. Like bulk KTP, periodically poled KTP can only perform well at low power levels (a few milliwatts or possibly even tens of milliwatts in the visible) but suffers from passive and induced absorption ("gray tracking") at higher power levels. In addition, KTP crystal production is not easily scalable to mass production quantities at low cost as is required by some applications such as consumer-electronics displays. $LiNbO_3$ and $LiTaO_3$ are scalable to high-volume production and can be readily periodically poled, but suffer from visible-light-induced degradation ("photo-refractive damage") that makes it impossible to use these crystals to produce even milliwatts of visible light without severe degradation. The photo-refractive damage can be reduced at elevated temperatures (>150° C.). However, this requires using ovens for maintaining the nonlinear crystals at a high-temperature. Such ovens are incompatible with a low-cost, efficient laser fabrication, especially in a microchip geometry. Thus, the laser designs described by Laurell, cannot be implemented in a high-power, low-cost, compact, and efficient architecture. Similarly, Brown (US Published Patent Application 2005/0,063,441), proposed designs for compact laser packages, which would appear to be suitable for low-cost applications. However, the Brown teaching is still centered on conventional nonlinear materials such as KTP and LBO. The possible use of PPLN and PPKTP is mentioned but it is not taught how one can overcome the limitations of these crystals, especially their afore mentioned reliability limitations.

It is known that congruent $LiNbO_3$ and $LiTaO_3$ suffer from photo-refractive damage due to visible light, and several ways to overcome this problem have been proposed. The high-temperature operation, mentioned above, partially solves the problem, but is not suitable for most applications. Another proposed solution is doping the congruent material during the crystal growth to suppress photo-refractive damage mechanisms (T. Volk, N. Rubinina, M. Wöhlecke, "Optical-damage-resistant impurities in lithium niobate," Journal of the Optical Society of America B, vol. 11, p. 1681 (1994)). Growing bulk crystals with a high degree of stoichiometry has been proposed as another method to suppress photo-refractive damage (Y. Furukawa, K. Kitamura, S. Takekawa, K. Niwa, H. Hatano, "Stoichiometric Mg:$LiNbO_3$ as an effective material for nonlinear optics," Optics Letters, vol. 23, p. 1892 (1998)).

However, none of the prior art workers have taught a means of achieving a high output power, stable ambient temperature operable frequency doubled laser suitable for producing green and blue light in a low-cost, mass-manufacturable design. We have found that if periodically poled $LiNbO_3$ or $LiTaO_3$ crystals are within 0.05% of stoichiometric they do not require any dopant to be stable at high output powers of up to 500 mW. For crystals that are within 0.6% of stoichiometric, doping with from about 0.1 to about 0.6 mole % of ZnO or MgO achieves substantially the same beneficial results as are obtained with stoichiometric, periodically poled $LiNbO_3$ or $LiTaO_3$ crystals. The present invention teaches a compact, efficient, and low-cost frequency-converted laser based on periodically poled materials that contain as dopants MgO or ZnO and/or have a specified degree of stoichiometry that ensures high reliability for these materials. ZnO or MgO-doped stoichiometric $LiNbO_3$ and $LiTaO_3$ are very different materials from their congruent counterparts and their altered ferroelectric properties make these materials exceedingly difficult to pole into the short-periods, several-micron-length domains required for frequency conversion into the visible spectral range. The technological challenges in producing periodically poled ZnO or MgO-doped and stoichiometric $LiNbO_3$ and $LiTaO_3$ have recently been overcome and these new materials shown to be manufacturable. Crystals with poling periods suitable for laser conversion into blue, green, and longer wavelength ranges have been produced and the technology for such production process is described in copending, commonly assigned Published US Patent Application 2005/0,133,477 the disclosure of which is hereby incorporated herein by this reference.

In short, known technical approaches cannot provide a reliable, cost-effective, and compact frequency converted laser. The present invention solves this problem and discloses a low-cost, efficient, and reliable solid-state laser architecture that is based on periodically poled $LiNbO_3$ or $LiTaO_3$ that contain dopants such as MgO or ZnO and/or have a specified degree of stoichiometry that ensures high reliability for these materials. The present invention also describes a compact, efficient, reliable, and low-cost solid-state laser, frequency converted into wavelength ranges, not available through direct semiconductor lasers, i.e. into the blue, green, yellow, orange, and near-ultraviolet wavelength regions, i.e., into wavelengths of about 275 nm to 635 nm. The present invention teaches a method of manufacturing compact and efficient visible or near-UV laser sources having output power levels of at least several hundreds of milliwatts and even higher, which levels are not achievable with existing technologies.

DETAILED DESCRIPTION OF THE INVENTION

Figure 1:
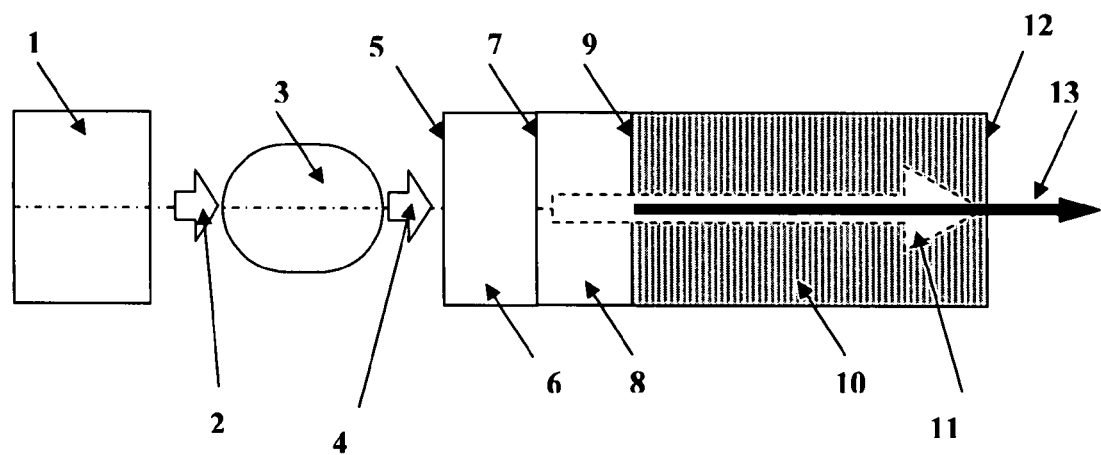
FIG. 1 shows a micro-chip embodiment of the present invention.

FIG. 1 illustrates a preferred embodiment of the present invention. The pump diode laser 1, emits a beam 2, for example, at a wavelength between 800 and 900 nm, such as ~808 nm or 885 nm for efficient absorption by the gain material (element) 8. The beam 2 is frequently astigmatic and beam-shaping optics 3 are advantageously used to convert the pump beam 2 into the beam 4 so that the beam 4 forms a circular cross-section of the desired diameter on the surface 7 of gain medium 8. This type of pumping arrangement is known in the art and can efficiently overlap the pump area in the gain element with the intracavity circulating beam, which must be a single-spatial mode (or $TEM_{00}$) for efficient non-linear frequency doubling. A suitable diameter for the pump spot on the gain element 8 is in the range of 50 to 300 microns. The beam-shaping optics can be a micro-lens, a gradient-index lens, or a combination of such optical elements. When efficiency can be sacrificed in favor of simplicity and compactness, the beam-shaping optics 3 can be eliminated. Another part of assembly 3 may be a volume Bragg grating used to narrow down the spectral emission of diode laser 1. Narrowing down the spectral output of the pump laser may be beneficial for the efficiency of the laser system. Methods to achieve such spectral narrowing have been described, e.g., in the paper by L. Glebov. "Optimizing and Stabilizing Diode Laser Spectral Parameters." Photonics Spectra, January 2005.

However, producing high laser source efficiency is a key benefit of the present invention. To maximize efficiency, we use a transparent optical material 6, which has a high thermal conductivity such as sapphire, undoped $YVO_4$, or undoped $Y_3Al_5O_{12}$ (YAG). Thus, element 6 is bonded to the gain element 8 and acts as a heat sink. The surfaces 5 and 7 are coated for high transmission at the pump laser wavelength, e.g., 808 nm. The coating of surface 7 also provides high reflectivity at the fundamental laser wavelength, such as 1064 nm, and serves as the first mirror of the solid-state laser cavity. The coating may be selected for lasing in the desired wavelength supported by the solid-state material 8, e.g. 1342 nm. In this instance, care must be taken to reduce the reflectivity of this mirror 7 or the second cavity mirror 12 at the dominant laser transition wavelength (1064 nm in the case of a $Nd:YVO_4$ pump laser ). Some examples of optically transparent heat sink material suitable for use as the element 6 include sapphire, undoped $YVO_4$, and undoped YAG. Of these elements, sapphire is the most efficient for heat sinking due to its high thermal conductivity and good thermal expansion match to $Nd:YVO_4$. In lower-power versions of this laser design (<1 W of absorbed pump power), traditional heat sinking methods such as mounting the gain element on a copper or another high-thermal-conductivity metallic mount are acceptable and are also within the scope of this invention.

Gain medium 8 is preferably a Nd-doped element with a higher gain in one axis, such as $Nd:YVO_4$ or $Nd:GdVO_4$ so that the element 8 provides both gain and polarization control for the laser cavity. The level of Nd doping for maximizing laser efficiency in this invention will typically be in the range of 0.5% to 3% atm (atomic percent). The element 8 also provides the transverse mode control in the otherwise flat-flat laser cavity through gain-guiding and thermal lensing effects.

The nonlinear crystal 10 is a periodically poled nonlinear crystal that belongs to the family of doped or stoichiometric nonlinear materials that ensure reliable crystal operation at both fundamental wavelength (namely, near-infrared) and at the second-harmonic wavelength (typically, visible). Specifically, these materials comprise PPMgOLN (periodically poled MgO-doped congruent $LiNbO_3$), PPMgOLT (periodically poled MgO-doped congruent $LiTaO_3$), PPZnOLN (periodically poled ZnO-doped congruent $LiNbO_3$), PPZnOLT (periodically poled ZnO-doped congruent $LiTaO_3$), PPSLN (periodically poled stoichiometric lithium niobate) or PPSLT (periodically poled stoichiometric lithium tantalate) The levels of doping and stoichiometry are selected to suppress optical degradation effects such as photo-refractive damage and visible-light-induced infrared absorption (also knows as GRIIRA and BLIIRA for green and blue light, respectively). A recent discussion on this subject can be found in the paper by Y. Furukawa, K. Kitamura, A. Alexandrovski, R. K. Route, M. M. Fejer, G. Foulon, "Green-induced infrared absorption in MgO doped $LiNbO_3$," Applied Physics Letters, vol. 78, p. 1970 (2001). Methods for mass manufacturing such periodically poled crystals are described by S. Essaian, one of the co-inventors of the present invention, in Published US Patent Application 2005/0,133,477 assigned to the same assignee as the present application.

The poling period of the nonlinear crystal 10 is chosen to maximize the efficiency of the second-harmonic generation of the fundamental beam. For example, the poling period of PPMgOLN for frequency doubling of 1064 nm into 532 nm is approximately 7 micron. The effective nonlinear coefficient for such a material is about 16 pm/V and can be as high as 20 pm/V when perfect grating structure and material stoichiometric uniformity are achieved. The high nonlinearity and high reliability of the nonlinear crystals are key advantages of the laser system of the present invention. Since the efficiency of nonlinear conversion scales with the square of the nonlinear coefficient, the use of such materials as PPMgOLN instead of traditional materials such as KTP (~3.5 pm/V for conversion into the green wavelength) or LBO (~1 pm/V) allows constructing more compact, less power consuming, and higher power output systems than traditional bulk materials allow. As a result of the high efficiency of nonlinear crystals used in this invention (such materials as PPMgOLN), short length of the green/blue laser microchip (and the corresponding short laser cavity) can be designed as well. This microchip laser design allows large longitudinal mode spacing and has tendency to generate single frequency radiation, which is requested by many instrumentation applications. For example, if it is necessary that length of said green laser microchip has been restricted less than 1.3 mm.

An additional advantage of using periodically poled materials compared to, e.g. KTP, is that only a single polarization of the fundamental beam is necessary for the second harmonic generation process. In KTP (most widely used crystal for SHG into the green wavelength range), two orthogonal polarizations at the fundamental wavelength have to be excited in the crystal (this constitutes the so-called type-II phase-matched SHG) and this creates possibilities for the depolarization of the intracavity laser beam, and, therefore, for the loss of both power and efficiency.

The use of optimal doping and stoichiometry for high reliability allows making reliable laser products without the need of expensive and space-consuming ovens to heat the nonlinear crystal to suppress its degradation. Finally, mass manufacturability of PPMgOLN and the other crystals useful in the practice of the present invention allows achieving mass production of compact visible lasers for high-volume consumer-electronics markets. It is important to point out that colors not available from direct semiconductor diode lasers can thus be achieved.

Using nonlinear crystals with non-periodic (chirped) or non-parallel (fan-out) poling patterns is also within the scope of the present invention. Another advantage provided by the high efficiency of the materials of the present invention such as PPMgOLN is that they provide design headroom. This means that the effective nonlinearity can be traded off for other parameters such a temperature or angular acceptance bandwidth for second-harmonic generation without significant penalty in generated second harmonic power. The reason is that the intracavity second harmonic generation is limited by the maximum amount of power the laser can emit at the fundamental wavelength. This was described by Smith (R. Smith, "Theory of intracavity optical second-harmonic generation," IEEE Journal of Quantum Electronics, vol. 6, p. 215, (1970)). After the laser limitation is reached, increasing crystal nonlinearity, length, or beam focusing can achieve no further increase in second harmonic power. While conventional bulk nonlinear crystals typically never reach this regime in continuous wave laser operation, the high-nonlinearity periodically poled crystals of the present invention do reach it. As a result, this allows one to improve laser cost and performance by decreasing nonlinear crystal length, modifying the poling pattern, and, especially, by using a low-cost, monolithic microchip laser cavity assembly which provides some efficiency limitations due to its inherent thermal gradients, even when the entire assembly is controlled as a whole. Thus, in a preferred embodiment, nonlinear crystal 10 is bonded to laser gain element 8, e.g. by mean of chemically activated direct bonding (glue-free optical contact). The input surface 9 of the nonlinear crystal has a coating and opticaly fine-polished to ensure high transmission at the fundamental wavelength and high reflection at the second harmonic wavelength. This arrangement also prevents the generated visible light from entering the gain element, which can be detrimental to the laser operation. It should be noted that glue(epoxy)-free bonding, which is preferred in the present invention, has seen significant progress recently, and, therefore, the monolithic assemblies disclosed here are readily manufacturable. A review of direct bonding techniques can be found in the paper by C. Myaft, N. Traggis, and K. Dessau, "Optical contacting grows more robust," Laser Focus World, January 2005, p. 95 the disclosure of which is incorporated herein.

The output surface 12 of the nonlinear crystal serves as the second mirror of the cavity. Therefore, it is preferably coated for high reflection at the fundamental laser wavelength and for high transmission at the second-harmonic wavelength. The longitudinal and lateral dimensions of the described arrangement are optimized for high efficiency as is known in the art of laser design. We have found that the nonlinear crystal length need not exceed 2-3 mm to obtain hundreds of milliwatts of power at the 532 nm (green color) wavelength. The optical beam 11 indicates the intracavity laser beam at the fundamental wavelength. The beam illustrates the cavity mode propagating in the direction away from gain element 8. The backward-propagating cavity mode overlaps this forward-propagating beam and, therefore, is not shown. Similarly, second-harmonic beams are generated in both the forward and backward directions. The backward-generated second-harmonic beam is reflected by the optical surface 9 and is recombined with the forward-generated second-harmonic beam so that a single beam 13 exits the laser cavity.

It should be noted that because both forward- and backward-generated second harmonic beams are coherent (i.e., have a definite phase relationship) with each other, they could optically interfere with each other, somewhat reducing the efficiency of nonlinear conversion. Several methods to overcome this problem can be utilized in the practice of the present invention. One method is to control the crystal temperature (the optimum point between maximizing interference to make it as close to constructive interference as possible and maximizing nonlinear conversion efficiency. Suitable temperatures range from about 20° C. to about 80° C. and can be easily achieved with the aid of a low-cost resistive heater element positioned under the nonlinear crystal. When the laser cavity is long enough to operate in multiple longitudinal modes, another method is to rely on some longitudinal modes extinguishing themselves in the (partially) destructive interference, while other modes enhance the total second-harmonic output through a constructive interference. In a multiple-longitudinal mode laser, this is achieved automatically as the modes favored in constructive interference will be outcoupled most efficiently.

Yet another advantage for the microchip assembly of the present invention is being able to use periodically poled crystals that are thick enough to be handled easily and be bonded to other crystals. Until recently, the commonly accepted opinion was that such materials as PPMgOLN can at best only be poled in thin wafers (0.5 mm thick or less) for conversion into blue-green colors and not really be poled at all in a production, non-research environment. Now, by using the method described by S. Essaian in Published US Patent Application 2005/0,133,477), it is possible to manufacture crystals as thick as 1 mm in high yield. This is a significant advantage for building a microchip laser. Thus, by using this recent achievement in crystal technology, one can obtain a new laser platform that surpasses existing platforms in its capabilities: i.e., power, efficiency, reliability, and cost.

Figure 2:
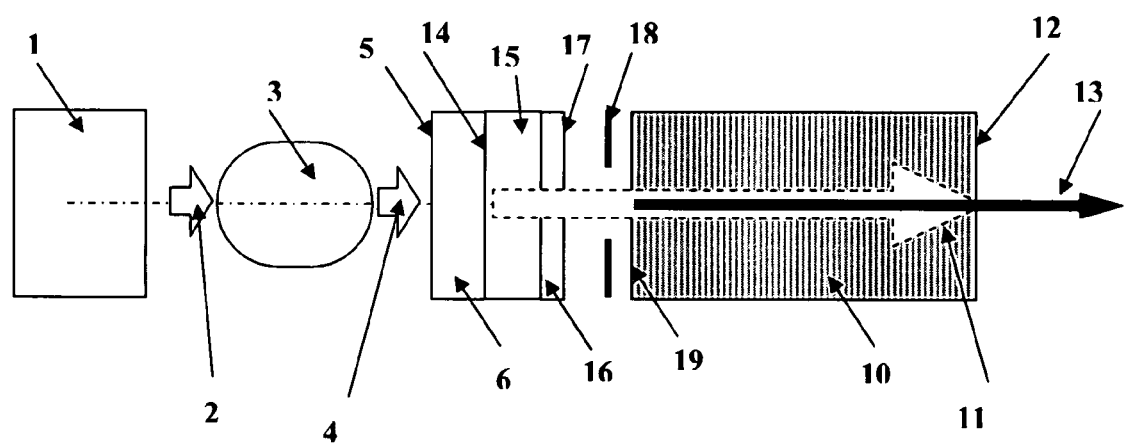
FIG. 2 shows an embodiment of the present invention with a gain medium that has no preferred polarization and a crystal with birefringent walk-off.

Regarding the invention embodiments illustrated in FIG. 2 and subsequent figures, many elements and their functions are essentially the same as in the embodiment illustrated in FIG. 1. Therefore, the differences will be highlighted in the subsequent description of these embodiments, while similarities can be understood from the description of FIG. 1.

The embodiment of FIG. 2 is especially useful when the gain medium (element 15 in FIG. 2) does not have a preferred direction for polarization to afford higher gain. A well-known example of such a gain media is Nd:YAG. One advantage of using Nd:YAG is that it can provide laser wavelengths, such as 946 nm, not available with Nd:YVO$_4$ or Nd:GdVO$_4$. This is desirable for obtaining other colors by nonlinear frequency conversion, e.g. blue color at a 473 nm wavelength. Gain materials may also be glass-based materials such as Yb:glass or Nd:glass, Yb:YAG glass and also, other like based crystals and glasses, ceramics.

While many elements and technical methods described in the embodiment of FIG. 1 apply to FIG. 2, the design of FIG. 2 provides polarization control via different means than the gain medium. Polarization control is a necessary part of the laser design since the second-harmonic generation process is polarization-sensitive. In order to preserve the low-cost, compact design concept of the present invention, a preferred embodiment of this invention utilizes an additional birefringent element 16. Element 16 is a birefringent crystal, suitable for intra-cavity laser design, cut at an angle to provide large walk-off between the two polarizations supported by this crystal. An example of material suitable for the use in element 16 is undoped yttrium vanadate (YVO$_4$). The walk-off in crystal 16 can be used to discriminate between the two polarizations by, for example, using an aperture 18, which provide higher loss to the unwanted polarization. While the illustration in FIG. 2 shows separate elements 15 (gain crystal), 16 (polarization control crystal for creating walk-off), 18 (aperture), and 19 (nonlinear crystal), they can also be joined in a monolithic assembly. In this case, a significant walk-off can be designed in so that the aperture can be aligned passively, i.e. before the laser is turned on.

Another way to discriminate between the two polarizations is to use a curved mirror or a lens on the right of the nonlinear crystal (not shown in the figure) so that one of the polarizations is walked out of alignment with respect to the optical axis defined by the lens or the mirror on one side and by the gain aperture on the other side. The concept is essentially similar to the embodiment with an aperture in that it provides higher loss to the unwanted polarization. Other elements and coatings in the embodiment shown in FIG. 2 are similar to those in FIG. 1.

Figure 3:
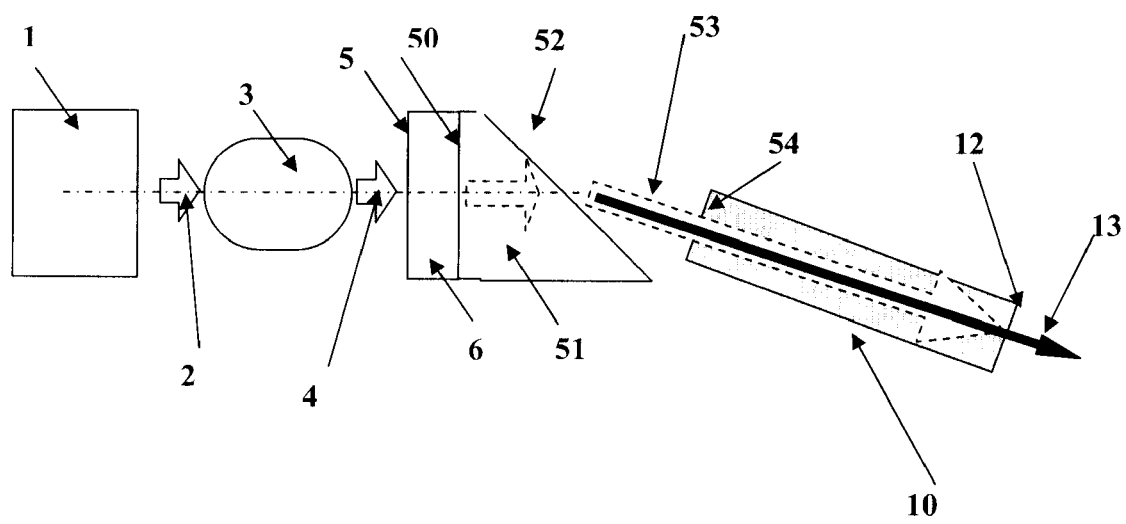
FIG. 3 shows an embodiment of the present invention with a gain medium that has no preferred polarization and an intracavity Brewster surface.

The design of FIG. 3 is similar to the design of FIG. 2 in that it is particularly useful when the gain medium (element 15 in FIG. 2) does not have a preferred direction for polarization with higher gain. To control the laser polarization for efficient nonlinear frequency doubling, this design relies on the intracavity Brewster surface 52, which can be left uncoated. One way to obtain a Brewster surface in the cavity without adding extra elements is to cut the gain crystal 51 at the Brewster angle. Brewster surfaces have high transmission for p-polarized light and lower transmission for s-polarized light. This fact can be used to tilt the gain crystal at the appropriate angle to form the laser cavity. The crystal shown in FIG. 3 appears thinner than in other figures. This is to illustrate the fact that the thinner (wafer) cross-section of the periodically poled crystal will typically be in the plane of the drawing, when a Brewster surface is present. Designs similar to the one illustrated in FIG. 3 have been used in the past (see, e.g., World Patent Application WO2005/036,703), but did not take advantage of the high-reliability, periodically poled crystals taught in the present invention.

It must be understood that FIG. 3 illustrates only one possible scenario of component arrangement with an intracavity Brewster surface. As in FIG. 1, this design can be monolithically built, e.g., by cutting the surface 54 of the nonlinear crystal 10 at an angle and joining the gain element and the nonlinear crystal. In this case, the Brewster angle cut is designed for the interface to be between optical materials 51 and 10 and not between either of these materials and air.

Figure 4:
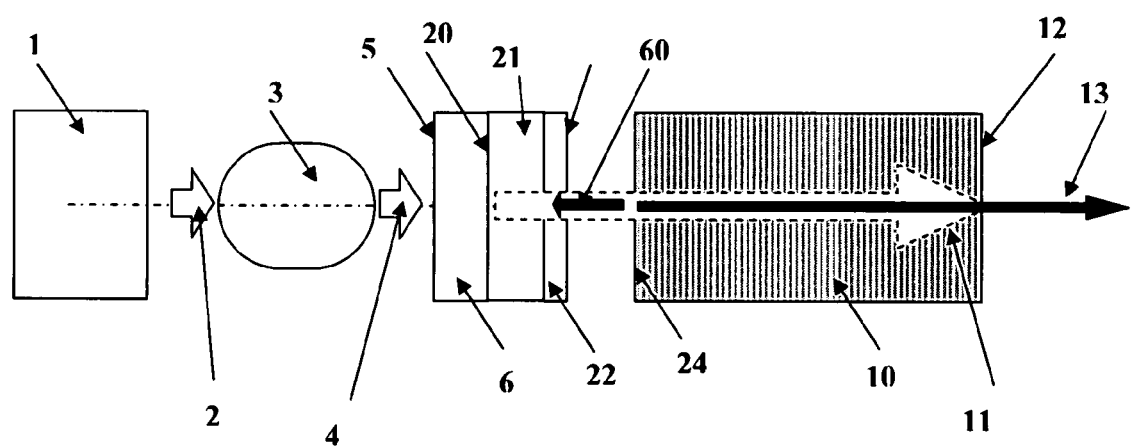
FIG. 4 shows an embodiment of the present invention with a gain medium that has a preferred polarization and a waveplate for rotating polarization of a backward-propagating second-harmonic beam

The embodiment shown in FIG. 4 illustrates and addresses the optimization of second-harmonic power extraction. As was discussed in the description for FIG. 1, the second harmonic light is generated in two opposite directions of propagation. In many cases the backward-generated beam can be recombined with the forward-generated beam via a high-reflectivity mirror coating for the backward-generated beam and possible destructive interference between the two beams can be avoided by thermal adjustments by using multi-longitudinal mode operation. However, in some cases it is more efficient to use the design shown in FIG. 4.

Element 23 is a waveplate (made, e.g., from quartz) that rotates polarization of both fundamental and second-harmonic beams. In this design, the waveplate is selected so that the polarization of the fundamental beam is rotated by 90 degrees after a single pass, and the polarization of the second harmonic beam is rotated by 45 degrees after a single pass. Waveplates of this type are called dual waveplates and are commercially available. Surface 23 is anti-reflection coated for both the fundamental and second harmonic beams. Surface 22 is anti-reflection coated for the fundamental beam, and coated for high reflection for the second harmonic beam. Since the fundamental light traverses the waveplate twice in one cavity round trip, it does not change its polarization and thus the waveplate does not disturb the operation of the fundamental laser. However, the second harmonic light, which also traverses the waveplate twice, changes its polarization to the orthogonal one and returns back through the nonlinear crystal 10 (the surface 24 is now anti-reflection coated for both fundamental and second harmonic beams) without interference with the forward-generated second-harmonic beam. This design is especially useful in applications for which the polarization of the output second harmonic beam is not critical. One such application is using the laser of the present invention for projection displays, which are based on digital light processing technology.

Figure 5:
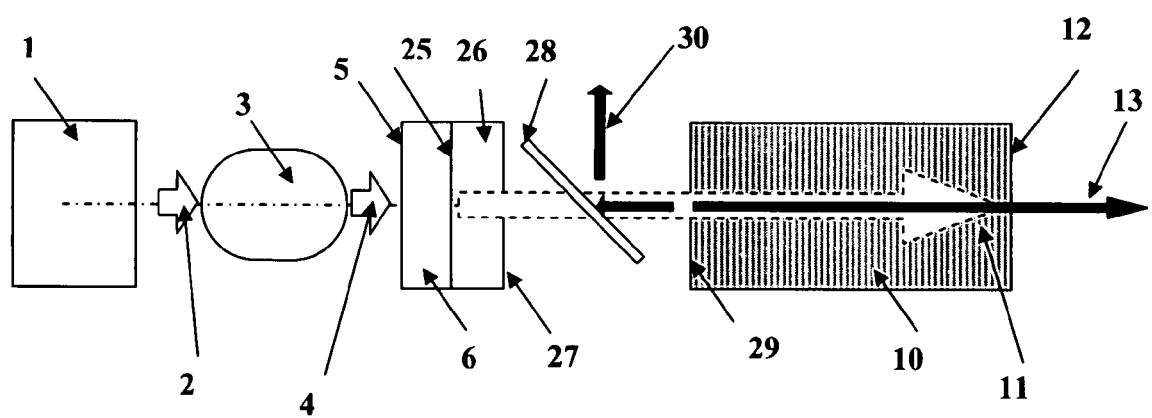
FIG. 5 shows an embodiment of the present invention with recovery of a backward-propagating second-harmonic beam via a turning mirror

The embodiment of FIG. 5 illustrates another method to extract the backward-generated second-harmonic beam when the use of waveplates in undesirable. The extraction is now done via a coated turning mirror 28, which has a high reflection for the second harmonic light and high transmission for the fundamental light. One instance when the turning mirror design of FIG. 5 may be preferred over the waveplate design of FIG. 4 is when the laser polarization is not locked by the gain element 6, e.g. when Nd:YAG is used. In this case, it is possible to also design polarization discrimination in the coatings of element 28 so that the laser is operating only in the desired polarization, providing efficient second-harmonic conversion. The re-directed, backward-generated second-harmonic beam 30 may be re-directed again by another mirror so that it propagates in the same direction as the forward-generated second-harmonic beam. Unlike the design of FIG. 4, this design will produce a linearly-polarized second-harmonic beam. This is desirable for applications such as using the laser for projection displays, based on liquid-crystal spatial light modulators, such as LCD or LCOS.

Figure 6:
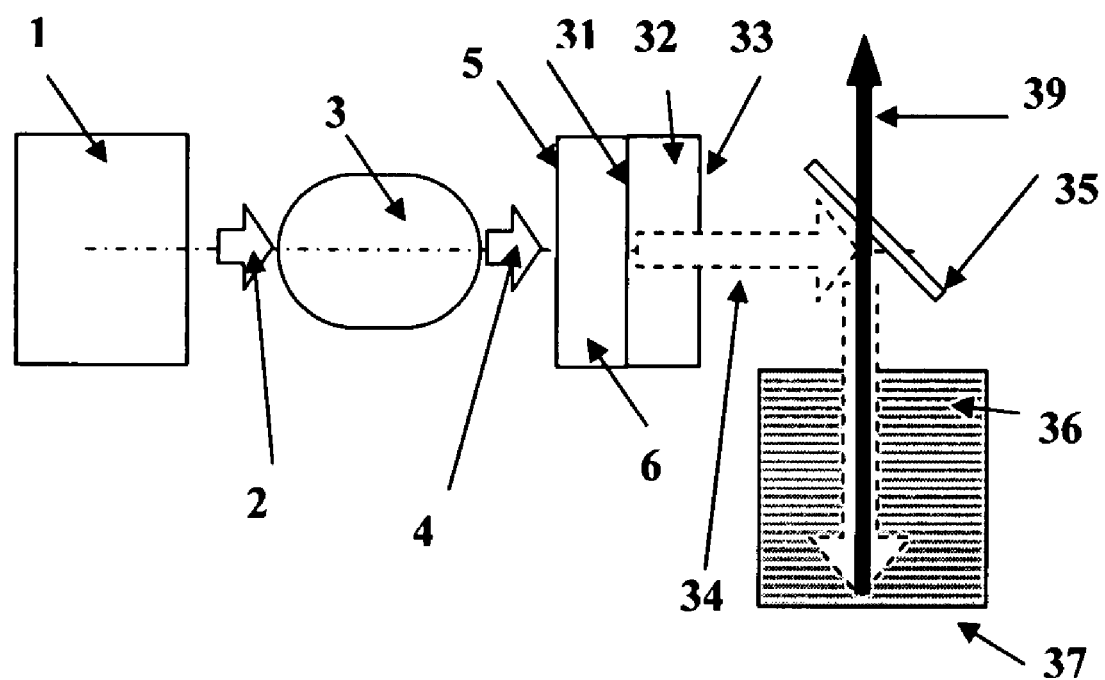
FIG. 6 shows an embodiment of the present invention with a folded cavity

The embodiment of FIG. 6 combines the forward- and backward-generated second harmonic beams by reflecting the forward-generated beam from the surface 37 of the nonlinear crystal 36. The coated glass plate 35 is preferably oriented at an angle of 45 degrees with respect to the gain crystal surface and is coated for high reflection at the fundamental laser wavelength and high transmission at the second-harmonic wavelength. A single, linearly polarized second-harmonic beam 39 is outcoupled from surface 35. As mentioned previously, having a tilted surface in the cavity makes it easier to discriminate polarizations by designing polarization-selective coatings. This is advantageous for gain crystals that do not define laser polarization direction, such as a Nd:YAG gain crystal. Like other embodiments of this invention, this design is modular and can be combined with the concepts illustrated in other embodiments, e.g. with the "waveplate design" of FIG. 4 configured to rotate polarization of the second-harmonic beam. One embodiment is to use the waveplate to complete the cavity below the surface 36, which will be suitably dual-band anti-reflection coated in this case.

Figure 7:
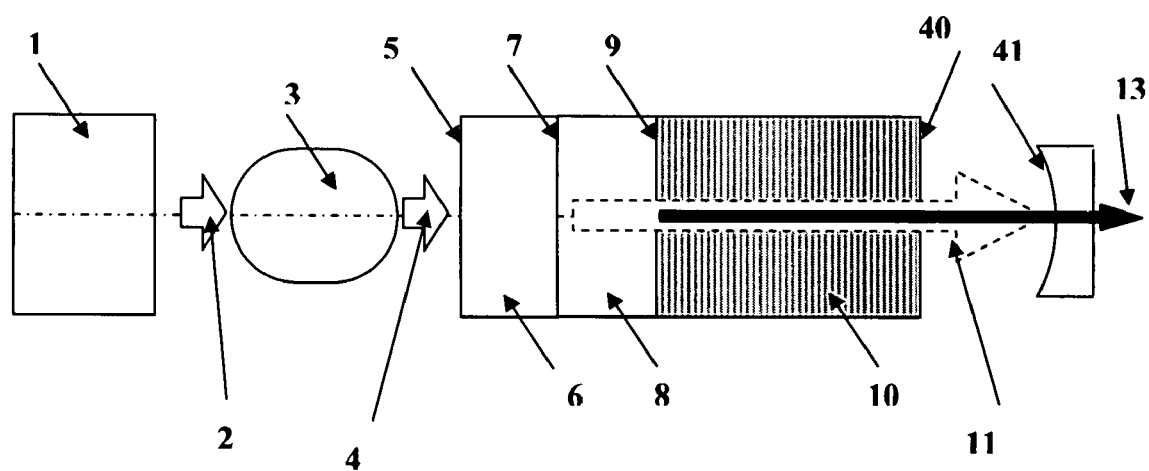
FIG. 7 shows an embodiment of the present invention with a curved mirror on either side of the cavity

The configuration shown in FIG. 7 is similar to the design of FIG. 1 and can be combined with the designs of FIGS. 2-6. The different element in this embodiment is a curved mirror 13, which has high reflectivity at the fundamental laser wavelength and high transmission at the second harmonic wavelength. This design may be somewhat higher-cost than the other designs illustrated but can be used for higher-power applications when thermal lens stabilization of the cavity transverse mode becomes less efficient than it is at lower power levels. Note that the curved mirror can be used on another side of the cavity as well in a non-monolithic arrangement.

Figure 8:
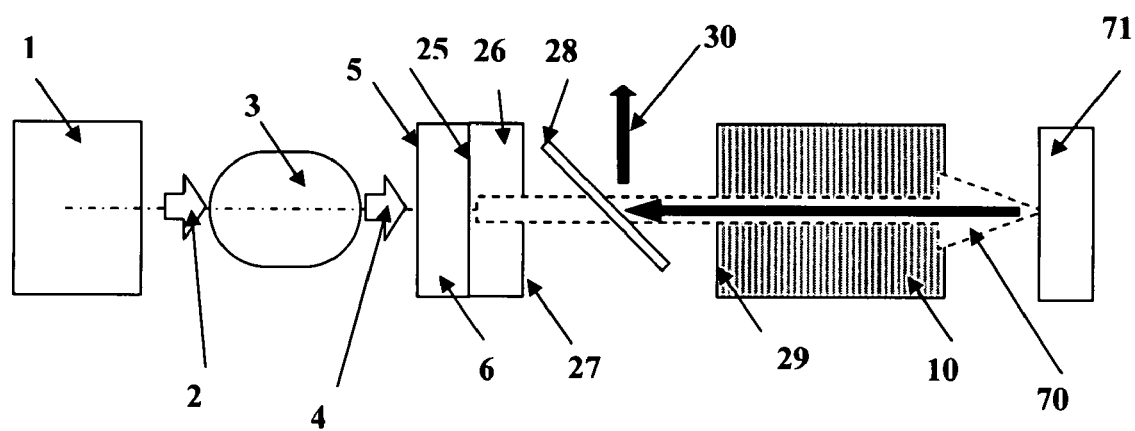
FIG. 8 shows an embodiment of the present invention with a saturable absorber.

The invention embodiments in FIGS. 1-7 illustrate low-cost and compact laser designs for continuous-wave (cw) operation. As will be apparent from FIG. 8, a compact and low-cost design for a pulsed (passively Q-switched or passively mode-locked) operation can also be obtained while enjoying all the advantages of the nonlinear crystals described in the present invention. FIG. 8 illustrates the design of FIG. 5, modified for operation with a saturable absorber 71. Element 71 is suitably a solid-state or semiconductor saturable absorber. An example of a solid-state saturable absorber is $Cr^{4+}$:YAG (chromium doped yttrium aluminum garnet) and this and other saturable absorber crystals ($V^{3+}$:YAG, $Co^{2+}$:$MgAl_2O_4$). An example of a semiconductor based saturable absorber is an epitaxially grown single quantum well or plural quantum wells (e.g., based on InGaAs material structure). The quantum well absorber may be grown together with an epitaxial mirror stack, also known as a distributed Bragg reflector, or DBR. Similarly, the solid-state saturable absorber crystal can be coated with a mirror coating to define the second cavity mirror. The methods of passive Q-switching and mode locking are known in the art of laser design and are described e.g., in the following references: R. Paschotta and U. Keller, "Ever higher power from mode-locked lasers," Optics and Photonics News, p. 50, May 2003; D-H Lee et al., "Intracavity-doubled self-Q-switched Nd,Cr: YAG 946/473 nm microchip laser," Chinese Physics Letters, vol. 19, p. 504 (2002); J. J. Zayhowski, "Passively Q-switched microchip lasers and applications," Rev. Laser Eng., vol. 26, p. 841 (1998). Furthermore, the saturable absorber and the gain element can be combined in a single element 26, e.g., by co-doping YAG crystal with Nd and Cr. The pulsed embodiment may be advantageous in applications where cw operation is not required. An additional advantage of the pulsed laser configuration is a much higher peak power in a pulse compared to the average power at the fundamental wavelength. This allows to further increase the efficiency of second harmonic generation and relaxes the temperature tolerance on the periodically poled nonlinear crystal.

Furthermore, a design with active Q-switching can also be realized without incurring a significant increase in the cavity cost and complexity. It is known that congruent periodically poled lithium niobate (PPLN) and lithium tantalate (PPLT) can be used as electro-optical Q-switch elements. A recent discussion on the subject can be found in the paper by Y. H. Chen, Y. C. Huang, Y. Y. Ling, and Y. F. Chen, "Intracavity PPLN crystals for ultra-low-voltage laser Q-switching and high-efficiency wavelength conversion," Applied Physics B: Lasers and Optics, vol. 80, p. 889 (2005). Again, it is a preferred and advantageous embodiment of the present invention to use periodically poled nonlinear materials with optimized doping or stoichiometry on which a reliable and efficient commercial laser product can rely. The illustration provided in FIG. 8 provides a compact, efficient, and reliable actively Q-switched laser, where the element 71 is now another periodically poled nonlinear crystal used as an electro-optic Pockels cell element i.e., an electro-optic Q-switch. The teaching of the following references is incorporated herein by this reference 1. W. P. Risk, T. R. Gosnell and A. V. Nurmikko, "Compact Blue-Green Lasers", Cambridge University Press (2003).
2. A. Mooradian, "Microchip laser," U.S. Pat. No. 5,365,539
3. F. Laurell, "Laser," U.S. Pat. No. 6,259,711
4. T. Georges, "Laser diode-pumped monolithic solid-state laser device and method of application of said device," World Patent Application WO2005/036,703
5. T. Volk, N. Rubinina, M. Wöhlecke, "Optical-damage-resistant impurities in lithium niobate," Journal of the Optical Society of America B, vol. 11, p. 1681 (1994).

6. Y. Furukawa, K. Kitamura, S. Takekawa, K. Niwa, H. Hatano, "Stoichiometric Mg:LiNbO₃ as an effective material for nonlinear optics," Optics Letters, vol. 23, p. 1892 (1998).
7. D. C. Brown, "High-density methods for producing diode-pumped microlasers," US patent application 2005/0,063,441
8. Spectralus Corporation Web Site: http://www.spectralus.com
9. S. Essaian, "Method for the fabrication of periodically poled lithium niobate and lithium tantalate nonlinear optical components," US patent application 2005/0,133,477.
10. Y. Furukawa, K. Kitamura, A. Alexandrovski, R. K. Route, M. M. Fejer, G. Foulon, "Green-induced infrared absorption in MgO doped LiNbO₃," Applied Physics Letters, vol. 78, p. 1970 (2001).
11. R. Smith, "Theory of intracavity optical second-harmonic generation," IEEE Journal of Quantum Electronics, vol. 6, p. 215, (1970).
12. C. Myatt, N. Traggis, and K. Dessau, "Optical contacting grows more robust," Laser Focus World, January 2005, p. 95.
13. L. Glebov. "Optimizing and Stabilizing Diode Laser Spectral Parameters." Photonics Spectra, January 2005.
14. R. Paschotta and U. Keller, "Ever higher power from mode-locked lasers," Optics and Photonics News, p. 50, May 2003;
15. D-H Lee et al., "Intracavity-doubled self-Q-switched Nd,Cr:YAG 946/473 nm microchip laser," Chinese Physics Letters, vol. 19, p. 504 (2002);
16. J. J. Zayhowski, "Passively Q-switched microchip lasers and applications," Rev. Laser Eng., vol. 26, p. 841 (1998).
17. Y. H. Chen, Y. C. Huang, Y. Y. Ling, and Y. F. Chen, "Intracavity PPLN crystals for ultra-low-voltage laser Q-switching and high-efficiency wavelength conversion," Applied Physics B: Lasers and Optics, vol. 80, p. 889 (2005).

The invention claimed is:

1. A microchip laser for providing a frequency doubled visible or near-ultraviolet output, the microchip laser comprising:
   a semiconductor diode pump laser providing a pump beam at a select wavelength, and
   a microchip laser cavity disposed to receive the pump beam, the laser cavity comprising:
      two mirrors, each mirror defined by a coated surface;
      a solid-state gain element pumped by the semiconductor diode pump laser and disposed between the two mirrors; and
      a bulk, periodically poled nonlinear frequency doubling crystal disposed between the two mirrors, the crystal having a thickness in the range of 0.5 mm to about 1 mm and comprising material selected from the group consisting of: periodically poled MgO-doped LiNbO₃, periodically poled MgO-doped LiTaO₃, periodically poled ZnO-doped LiNbO₃, periodically poled ZnO-doped LiTaO₃, periodically poled stoichiometric LiNbO₃, periodically poled stoichiometric LiTaO₃;
      wherein the gain element and the frequency doubling crystal are formed together as a monolithic assembly.

2. The microchip laser of claim 1, wherein the gain element comprises: a crystal that has a larger gain along one of its crystalline axes than along its other crystalline axes.

3. The microchip laser of claim 1, wherein the gain element comprises a material selected from the group consisting of: Nd:YVO₄, Nd:GdVO₄, Nd:YGdVO₄, Nd:YAG, Nd:YLF, Yb:glass, Yb:YAG; and Nd:glass.

4. The microchip laser of claim 1, further comprising an optical element disposed to condition the pump beam.

5. The microchip laser of claim 1, wherein the pump beam is delivered to the gain element without use of beam shaping optics.

6. The microchip laser of claim 1, wherein the pump laser is spectrally narrowed using a volume Bragg grating.

7. The microchip laser of claim 1, wherein the frequency doubling crystal is selected from the group consisting of: periodically poled MgO-doped LiNbO₃, periodically poled MgO-doped near-stoichiometric LiNbO₃, periodically poled MgO-doped LiTaO₃, periodically poled MgO-doped near-stoichiometric LiTaO₃, periodically poled ZnO-doped LiNbO₃, periodically poled ZnO-doped near-stoichiometric LiNbO₃, periodically poled ZnO-doped LiTaO₃, and periodically poled ZnO-doped near-stoichiometric LiTaO₃; and
   wherein the MgO or ZnO dopant is present in an amount of 0.1 to 7 mol % and the LiNbO₃ and LiTaO₃ are congruent or are within 0.6% of stoichiometric.

8. The microchip laser of claim 1, wherein the frequency doubling crystal is stoichiometric LiNbO₃ or stoichiometric LiTaO₃.

9. The microchip laser of claim 1, wherein formation of the monolithic assembly is achieved by glue-free direct bonding.

10. The microchip laser of claim 1, wherein the microchip has a length of less than 1.3 mm, resulting in the laser cavity generating single-frequency radiation at about 532 nm or about 473 nm.

11. The microchip laser of claim 1, wherein one of the two mirrors comprises an end mirror of the laser cavity and is formed on an output face of the frequency doubling crystal, the end mirror of the laser cavity being formed by coating to provide for high reflection at a fundamental wavelength of the laser cavity and high transmission at a second harmonic wavelength thereof.

12. The microchip laser of claim 1, wherein one of the two mirrors comprises an end mirror of the laser cavity and is formed on an input face of the frequency doubling crystal or on an input face of the gain element, the end mirror being formed by coating for high reflection at a second harmonic wavelength of the laser cavity to thereby collect any backward-generated second-harmonic beam.

13. The microchip laser of claim 1, wherein the gain element is mounted on an optically transparent material that has high thermal conductivity.

14. The microchip laser of claim 13, wherein the optically transparent material is selected from the group consisting of: sapphire, undoped YVO₄, and undoped YAG.

15. The microchip laser of claim 1, wherein the gain element comprises material selected from the group consisting of: Nd:YVO₄, Nd:GdVO₄, and Nd:YGdVO₄, to achieve polarization control in a desired polarization axis.

16. The microchip laser of claim 1, wherein the pump laser is a continuous wave or pulsed laser.

17. The microchip laser of claim 1, further comprising a resistive heater providing temperature control.

18. The microchip laser of claim 4, wherein the optical element comprises a microlens or a gradient-index lens, and directs the pump beam to the gain element.

19. A microchip laser for providing a frequency doubled output, the microchip laser comprising:
   a diode pump laser providing a pump beam at a select wavelength, and
   a microchip laser cavity disposed to receive the pump beam, the laser cavity comprising:

two mirrors;
  a solid-state gain element pumped by the diode pump laser and disposed between the two mirrors; and
  a bulk, periodically poled nonlinear frequency doubling crystal disposed between the two mirrors, the crystal having a thickness in the range of 0.5 mm to about 1 mm and comprising material selected from the group consisting of: periodically poled MgO-doped LiNbO$_3$, periodically poled MgO-doped LiTaO$_3$, periodically poled ZnO-doped LiNbO$_3$, periodically poled ZnO-doped LiTaO$_3$, periodically poled stoichiometric LiNbO$_3$, periodically poled stoichiometric LiTaO$_3$;
  wherein the gain element and the frequency doubling crystal form together a monolithic assembly achieved by direct bonding.

20. The microchip laser of claim 19, wherein the gain element comprises: a crystal that has a larger gain along one of its crystalline axes than along its other crystalline axes.

21. The microchip laser of claim 19, wherein the gain element comprises a material selected from the group consisting of: Nd:YVO$_4$, Nd:GdVO$_4$, Nd:YGdVO$_4$, Nd:YAG, Nd:YLF, Yb:glass, Yb:YAG; and Nd:glass.

22. The microchip laser of claim 19, wherein the pump laser is spectrally narrowed using a volume Bragg grating.

23. The microchip laser of claim 19, wherein the frequency doubling crystal is selected from the group consisting of: periodically poled MgO-doped LiNbO$_3$, periodically poled MgO-doped near-stoichiometric LiNbO$_3$, periodically poled MgO-doped LiTaO$_3$, periodically poled MgO-doped near-stoichiometric LiTaO$_3$, periodically poled ZnO-doped LiNbO$_3$, periodically poled ZnO-doped near-stoichiometric LiNbO$_3$, periodically poled ZnO-doped LiTaO$_3$, and periodically poled ZnO-doped near-stoichiometric LiTaO$_3$; and
  wherein the MgO or ZnO dopant is present in an amount of 0.1 to 7 mol % and the LiNbO$_3$ and LiTaO$_3$ are congruent or are within 0.6% of stoichiometric.

24. The microchip laser of claim 19, wherein one of the two mirrors comprises an end mirror of the laser cavity and is formed on an output face of the frequency doubling crystal, the end mirror of the laser cavity being formed by coating to provide for high reflection at a fundamental wavelength of the laser cavity and high transmission at a second harmonic wavelength thereof.

25. The microchip laser of claim 19, wherein one of the two mirrors comprises an end mirror of the laser cavity and is formed on an input face of the frequency doubling crystal or on an input face of the gain element, the end mirror being formed by coating for high reflection at a second harmonic wavelength of the laser cavity to thereby collect any backward-generated second-harmonic beam.

26. The microchip laser of claim 19, wherein the gain element is mounted on an optically transparent material that has high thermal conductivity.

27. The microchip laser of claim 26, wherein the optically transparent material is selected from the group consisting of: sapphire, undoped YVO$_4$, and undoped YAG.

28. The microchip laser of claim 19, wherein the gain element comprises material selected from the group consisting of: Nd:YVO$_4$, Nd:GdVO$_4$, and Nd:YGdVO$_4$, to achieve polarization control in a desired polarization axis.

* * * * *